US008995128B2

(12) United States Patent
Yamanaka

(10) Patent No.: US 8,995,128 B2
(45) Date of Patent: Mar. 31, 2015

(54) POWER CONVERSION APPARATUS

(75) Inventor: Yasunori Yamanaka, Fukuoka (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 332 days.

(21) Appl. No.: 13/466,127

(22) Filed: May 8, 2012

(65) Prior Publication Data

US 2013/0170270 A1    Jul. 4, 2013

(30) Foreign Application Priority Data

Dec. 28, 2011  (JP) ................................. 2011-288787

(51) Int. Cl.
*H05K 7/20*      (2006.01)
*H05K 7/14*      (2006.01)

(52) U.S. Cl.
CPC ...... *H05K 7/1432* (2013.01); *H01L 2924/0002* (2013.01)
USPC .......................................... 361/695; 363/141

(58) Field of Classification Search
CPC .................... H01J 37/32926; H01J 37/32935; B42D 2035/34; B42D 2035/08; B42D 2035/50; B42D 25/00
USPC ......... 361/42, 679.33, 690, 695, 753; 363/16, 363/17, 19, 34, 39, 141, 144, 146, 132
See application file for complete search history.

(56) References Cited

U.S. PATENT DOCUMENTS

| 5,909,061 | A  | * | 6/1999 | Sasaki et al. ................. 307/44 |
| 5,942,818 | A  | * | 8/1999 | Satoh et al. ................... 310/46 |
| 6,843,335 | B2 | * | 1/2005 | Shirakawa et al. ........... 180/65.1 |
| 7,324,337 | B2 | * | 1/2008 | Padin ............................ 361/695 |
| 7,388,348 | B2 | * | 6/2008 | Mattichak .................... 320/101 |
| 8,243,447 | B2 | * | 8/2012 | Fujiki et al. .................. 361/695 |

FOREIGN PATENT DOCUMENTS

| JP | 08-270975   | * | 10/1996 |
| JP | 11-122932   | * | 4/1999  |
| JP | 2001-028884 | * | 1/2001  |
| JP | 2011-160568 |   | 8/2011  |

OTHER PUBLICATIONS

Japanese Office Action for corresponding JP Application No. 2011-288787, Jul. 17, 2012.
Chinese Office Action for corresponding CN Application No. 201210156563.0, Sep. 24, 2014.

* cited by examiner

*Primary Examiner* — Rajnikant Patel
(74) *Attorney, Agent, or Firm* — Mori & Ward, LLP

(57) ABSTRACT

A power conversion apparatus according to an embodiment includes a case that can be provided on a mounting wall surface and places therein an electric reactor and a power conversion board for performing power conversion between a predetermined power generator and a commercial electric power system. The case is sectioned into a central area and first and second side areas that sandwich the central area therebetween. The electric reactor is arranged in the central area.

10 Claims, 12 Drawing Sheets

POWER CONVERSION APPARATUS

CROSS-REFERENCE TO RELATED APPLICATION

This application is based upon and claims the benefit of priority of the prior Japanese Patent Application No. 2011-288787, filed on Dec. 28, 2011, the entire contents of which are incorporated herein by reference.

FIELD

The embodiment discussed herein is directed to a power conversion apparatus.

BACKGROUND

A system that supplies energy obtained from sunlight or the like is recently developed. To use an electric power generated by sunlight or the like in a standard home requires a power conversion apparatus that converts the generated DC power into AC power and supplies the converted AC power.

For example, a power conditioner that boosts the DC power generated by solar cells by using a booster circuit and then converts the boosted DC power into AC power substantially the same as that of AC power source-based AC power by using an inverter circuit is known as the power conversion apparatus.

The conventional technology has been known as disclosed in, for example, Japanese Laid-open Patent Publication No. 2011-160568.

However, the conventional power conversion apparatus still requires improving the apparatus itself to have the configuration further suitable for wall mounting as a wall-mounted apparatus for standard home.

In other words, the conventional configuration including the configuration of the power conversion apparatus disclosed in Japanese Laid-open Patent Publication No. 2011-160568 is that a comparatively heavy electric reactor is arranged at one side of a case among components that are housed in the case to constitute the power conversion apparatus. Therefore, its centroid leans to one-side edge and thus a wall-mounted state easily becomes unstable.

SUMMARY

A power conversion apparatus according to an aspect of an embodiment includes a case that can be provided on a mounting wall surface and places therein an electric reactor and a power conversion board for performing power conversion between a predetermined power generator and a commercial electric power system. The case is sectioned into a central area and first and second side areas that sandwich the central area therebetween and the electric reactor is arranged in the central area.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF EMBODIMENT

A power conversion apparatus according to an embodiment includes a case that can be provided on a mounting wall surface and places therein an electric reactor and a power conversion board for performing power conversion between a predetermined power generator and a commercial electric power system. The case is sectioned into a central area and first and second side areas that sandwich the central area therebetween and the electric reactor is provided in the central area.

Figure 1:
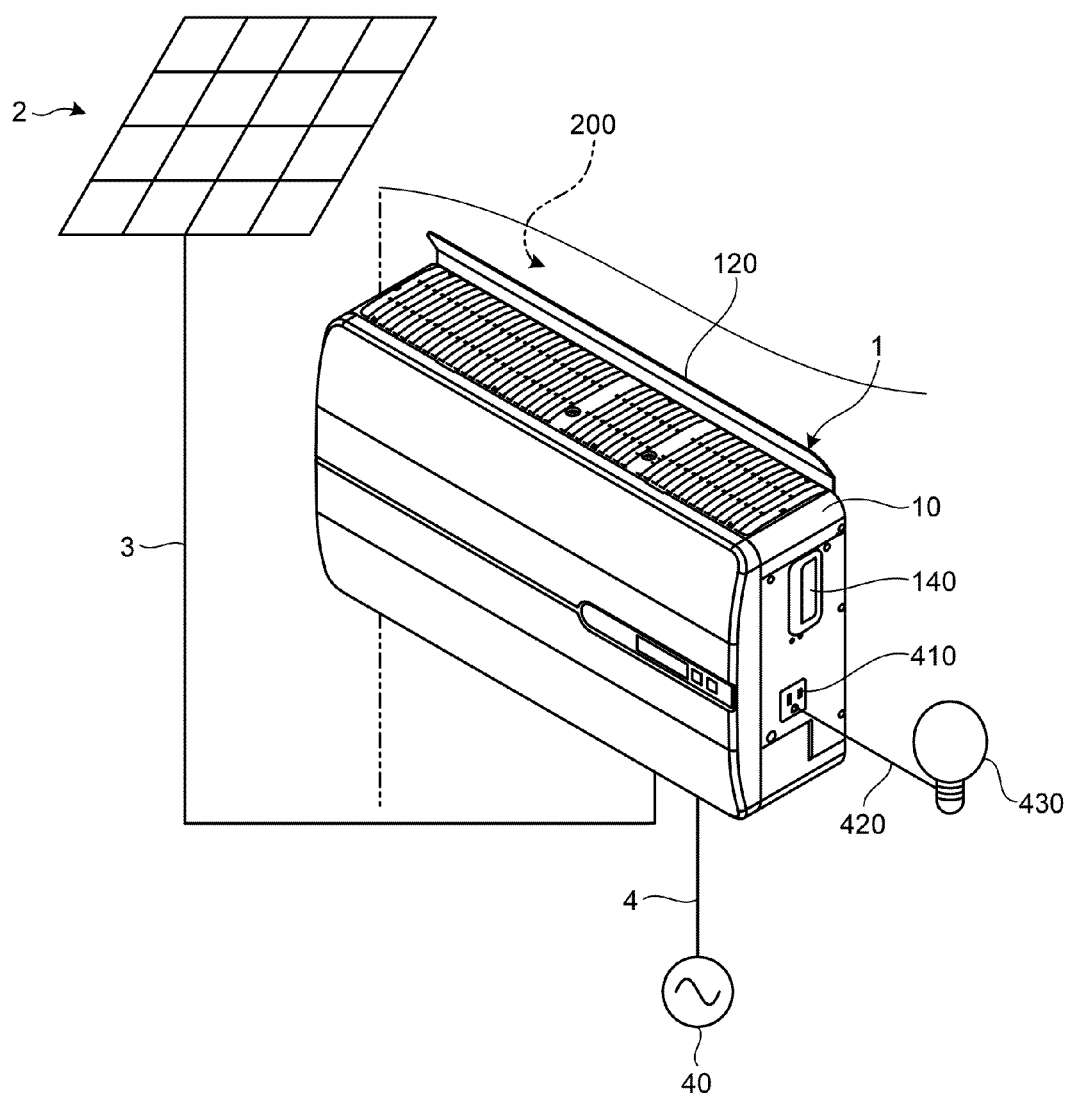
FIG. 1 is an explanation diagram illustrating a busy condition of a power conversion apparatus according to an embodiment.
Figure 2:
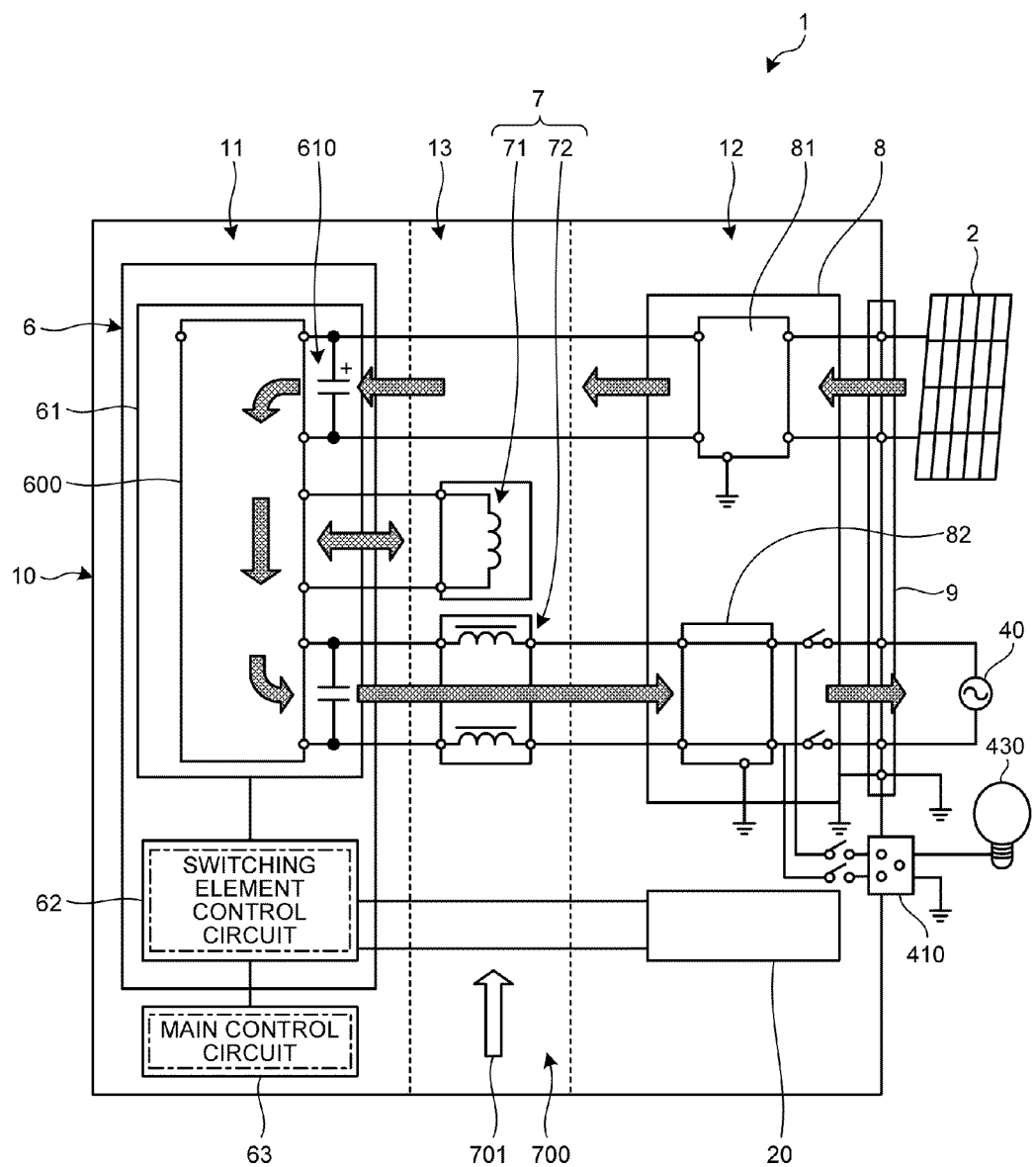
FIG. 2 is a typical explanation diagram illustrating an internal layout of a case of the power conversion apparatus.
Figure 3:
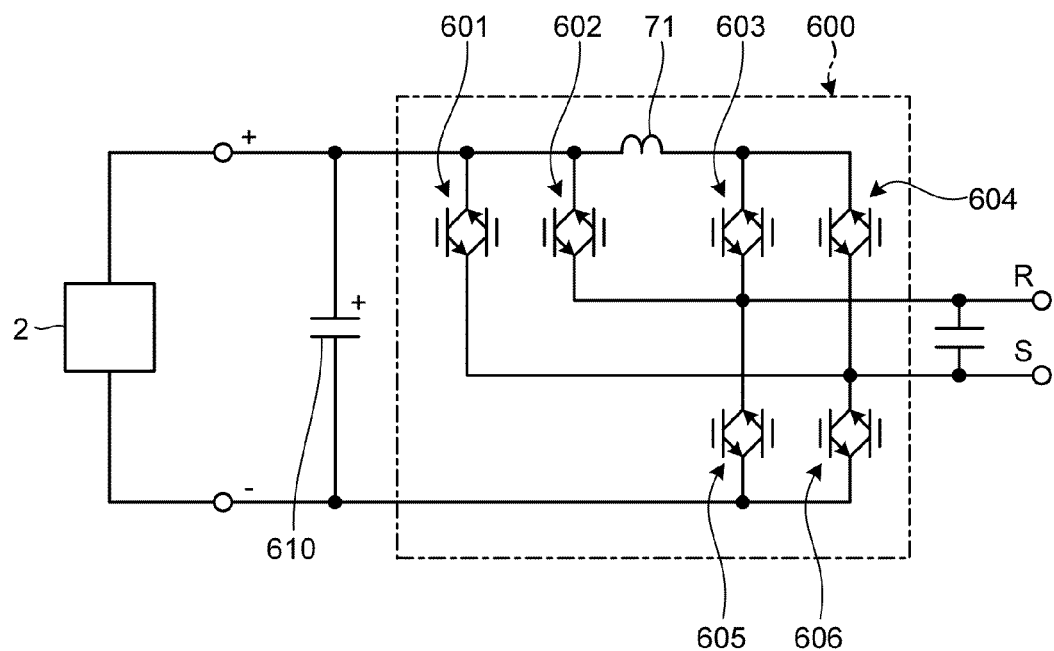
FIG. 3 is a circuit diagram of a first board of the power conversion apparatus.

FIG. 1 is an explanation diagram illustrating a busy condition of a power conversion apparatus 1 according to the embodiment. FIG. 2 is a typical explanation diagram illustrating an internal layout of a case 10 of the power conversion apparatus 1. FIG. 3 is a circuit diagram of a power conversion board of the power conversion apparatus 1.

The power conversion apparatus 1 according to the present embodiment has a wall-mounting configuration that the power conversion apparatus is provided on a predetermined mounting wall surface 200. In other words, the power conversion apparatus 1 can be mounted on the mounting wall surface 200 of a residential building via a mounting base plate 120, for example. Moreover, when the power conversion apparatus 1 is illustrated, FIGS. 4 to 10 indicate that the mounting base plate 120 is provided on the backside of the power conversion apparatus 1.

As illustrated in FIG. 1, the power conversion apparatus 1 mounted on the mounting wall surface 200 is connected to a solar cell panel 2, which is a DC power generation means, via an input cable 3 and is also connected to an AC power source 40 via a single-phase three-wire output cable 4. Moreover, the solar cell panel 2 is constituted by a plurality of solar cells that receives sunlight and generates DC power. For example, the solar cell panel 2 is provided on a roof of the residential building, or the like.

The power conversion apparatus 1 is provided with an electrical outlet 410 that is an output terminal on the right lateral surface of the case. For example, an electric power can be supplied to an electric appliance 430 during the power outage by linking a cord 420 to the electrical outlet 410. Hereinafter, when a relative positional relationship between components of the power conversion apparatus 1 is explained, directions are indicated by up and down, left and right, front and back, and near side and far side. In this case, the reference of each direction is the direction of the case when a user mounts the power conversion apparatus 1 on the wall and looks at the power conversion apparatus 1 from its front side.

In this way, the power conversion apparatus 1 can convert DC power, which is generated by the solar cell panel 2 that receives sunlight, into AC power and can supply the converted AC power to the AC power source 40 and the electric appliance 430.

As described above, the power conversion apparatus 1 according to the present embodiment can be provided on the mounting wall surface 200 and includes the case 10 for providing it on the mounting wall surface 200. As illustrated in FIG. 2, the case 10 places therein an electric reactor 7 and a power conversion board 6 that is a power board.

The power conversion board 6 performs power conversion between the solar cell panel 2 that is a predetermined power generator and a commercial electric power systems such as the AC power source 40 and the electric appliance 430. The electric reactor 7 has a function for boosting the DC power to be supplied to the power conversion board 6 and also suppressing outward outflow of higher harmonic waves to be generated by the power conversion board 6.

As illustrated in FIG. 2, the electric reactor 7 of the power conversion apparatus 1 according to the present embodiment includes a direct-current electric reactor 71 and an alternating-current electric reactor 72. The direct-current electric reactor 71 boosts DC power to be supplied to a first board (hereinafter, "first board 61") of the power conversion board 6 if desired. The alternating-current electric reactor 72 suppresses the outward outflow of higher harmonic waves that are generated by the first board 61. Herein, for the sake of convenience, it is illustrated in FIG. 2 that the direct-current electric reactor 71 is located more upward than the alternating-current electric reactor 72. However, as described below, the power conversion apparatus 1 according to the present embodiment may have a configuration that the direct-current electric reactor 71 is located more downward than the alternating-current electric reactor 72 (see FIGS. 4 and 5).

The power conversion board 6 includes the first board 61, a power module 600, and a second board 62. The first board 61 is provided with a main circuit smoothing capacitor 610 and a snubber circuit (not illustrated). The power module 600 includes switching elements 601 to 606 (see FIG. 3) that are electrically connected to the main circuit smoothing capacitor 610 and the snubber circuit. The second board 62 is provided with a switching element control circuit that controls the switching elements 601 to 606.

As illustrated in FIG. 2, the case 10 is further provided with a filter board 8 and an external connection terminal pedestal 9. The external connection terminal pedestal 9 includes an input terminal and an output terminal for the power conversion board 6. The filter board 8 includes an output-side noise filter 82 and an input-side noise filter 81 that remove high-frequency noises that are generated by the power conversion board 6.

In this way, the DC power generated by the solar cell panel 2 reaches a smoothing unit, in which the main circuit smoothing capacitor 610 is arranged, from the input-side noise filter 81 of the filter board 8 by way of the input terminal of the external connection terminal pedestal 9 provided on the one-side end face of the case 10. Then, the DC power reaches the power module 600, which includes the switching elements 601 to 606 that constitute a matrix converter circuit to be described below, from the smoothing unit to be converted into AC power. After that, the AC power converted from the DC power is supplied to the AC power source 40 and the electrical outlet 410, which are provided on the external connection terminal pedestal 9 provided on the one-side end face of the case 10, via the alternating-current electric reactor 72 for suppressing higher harmonic waves and the output-side noise filter 82.

As illustrated in FIG. 2, the horizontally long and substantially rectangular case 10 of the power conversion apparatus 1 described above is sectioned into a central area 13 and first and second side areas 11 and 12 that sandwich the central area 13 therebetween. The electric reactor 7 that is relatively heavy in the power conversion apparatus 1 is arranged in the central area 13.

In other words, the electric reactor 7 according to the present embodiment includes the direct-current electric reactor 71 for boosting and the alternating-current electric reactor 72 for suppressing higher harmonic waves, as described above. The weight of the electric reactor 7, which includes the direct-current electric reactor 71 and the alternating-current electric reactor 72, accounts for 30% to 40% of the total weight of the power conversion apparatus 1. The electric reactor 7 that is the heavy load is arranged at the substantially central position of the case 10 to better its weight balance.

By employing this configuration, the weight balance of the power conversion apparatus 1 is improved, and thus its posture is stable even if the power conversion apparatus 1 is in the state where it is mounted on the mounting wall surface 200 as illustrated in FIG. 1. In other words, a fixture such as a screw by which the mounting base plate 120 is attached to the mounting wall surface 200 does not have a partially concentrated load and thus can fix the power conversion apparatus 1 on the wall surface.

The power conversion apparatus 1 according to the present embodiment includes the power conversion board 6 that is arranged in the first side area 11 as illustrated in FIG. 2. Moreover, the external connection terminal pedestal 9 and the filter board 8, which includes the output-side noise filter 82 and the input-side noise filter 81 that remove high-frequency noises generated by the power conversion board 6, are arranged in the second side area 12. Therefore, a main circuit can be electrically connected by simple wiring in which the main circuit is completely wired by performing only one reciprocating action in the case 10, in which starting and ending points are the input terminal and the output terminal of the external connection terminal pedestal 9 and the turning point is the power conversion board 6. In other words, wiring saving becomes possible and further reduction in size and weight of the power conversion apparatus 1 becomes possible.

Herein, it has been explained that the first side area 11 is at the left side of the central area 13 and the second side area 12 is at the right side of the central area 13. These positions may be interchanged. Moreover, the housing area of the power conversion board 6 and the housing area of the external connection terminal pedestal 9 and the filter board 8 may be interchanged. In other words, the external connection terminal pedestal 9 and the filter board 8 may be arranged in the first side area 11 and the power conversion board 6 may be arranged in the second side area 12.

As described above, the case 10 of the power conversion apparatus 1 according to the present embodiment is sectioned into three areas (the first side area 11, the central area 13, and the second side area 12) in a longitudinal direction, and the electric reactor 7 that is a heavy load is arranged in the central area 13. Moreover, the power conversion board 6 lightweighter than the electric reactor 7 is arranged in one of the first side area 11 and the second side area 12 that are provided at both sides of the central area to sandwich the electric reactor therebetween. On the other hand, the external connection terminal pedestal 9 and the filter board 8 lightweighter than the electric reactor 7 are arranged in the other area.

The power conversion unit has a configuration that the first board 61 of the power conversion board 6 arranged in the first side area 11 is connected to the power module 600 to convert DC power generated by the solar cell panel 2 into AC power. The power module 600 includes the plurality of switching elements 601 to 606 (see FIG. 3) that constitutes the matrix converter circuit. Moreover, the main circuit smoothing capacitor 610 is provided in the first board 61.

Furthermore, a main control board 63 that is provided with a main control circuit is arranged in the first side area 11 in addition to the first board 61 and the second board 62. Herein, the main control board 63 may be arranged in the second side area 12.

Figure 4:
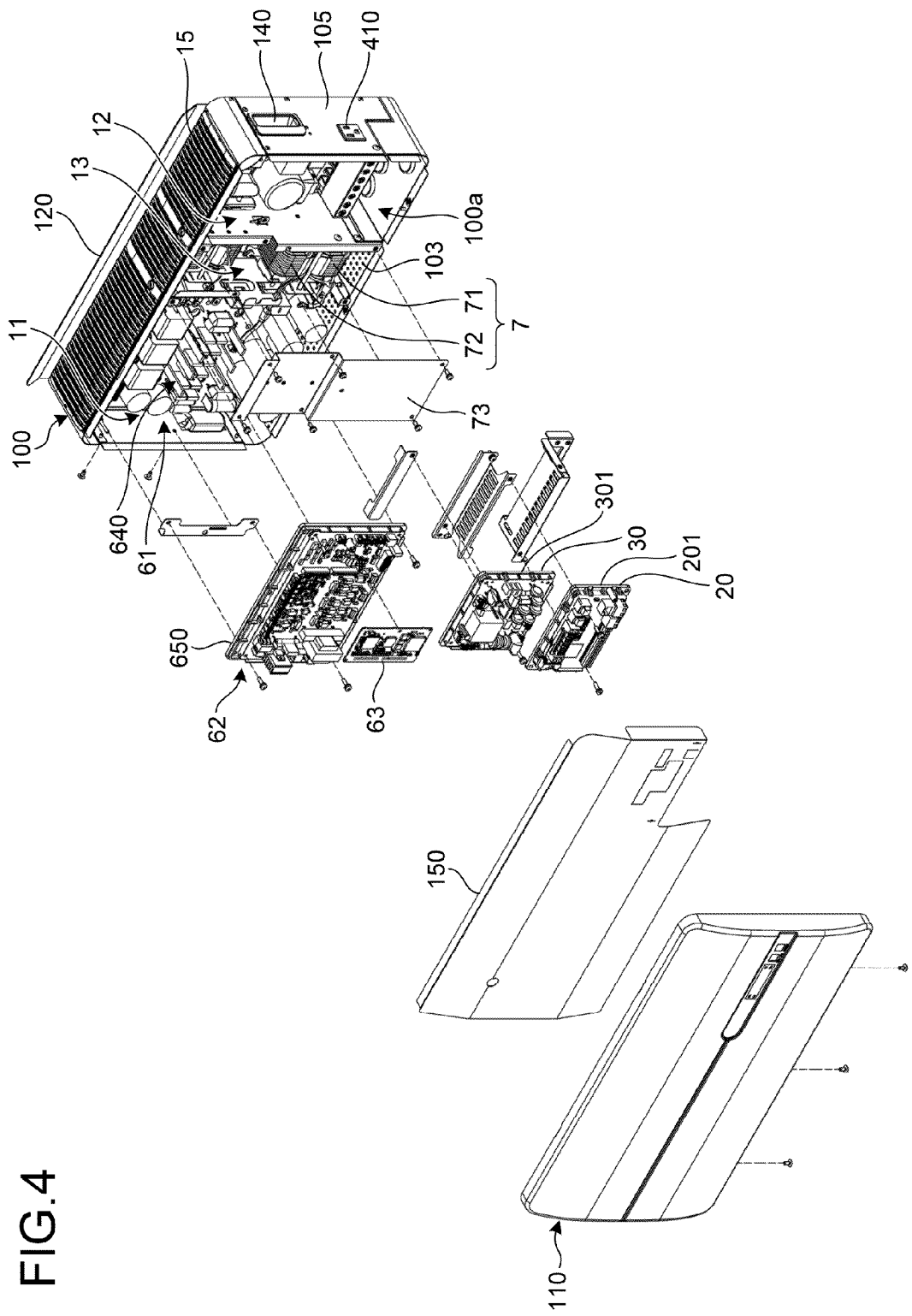
FIG. 4 is a partially exploded perspective view of the power conversion apparatus.
Figure 9:
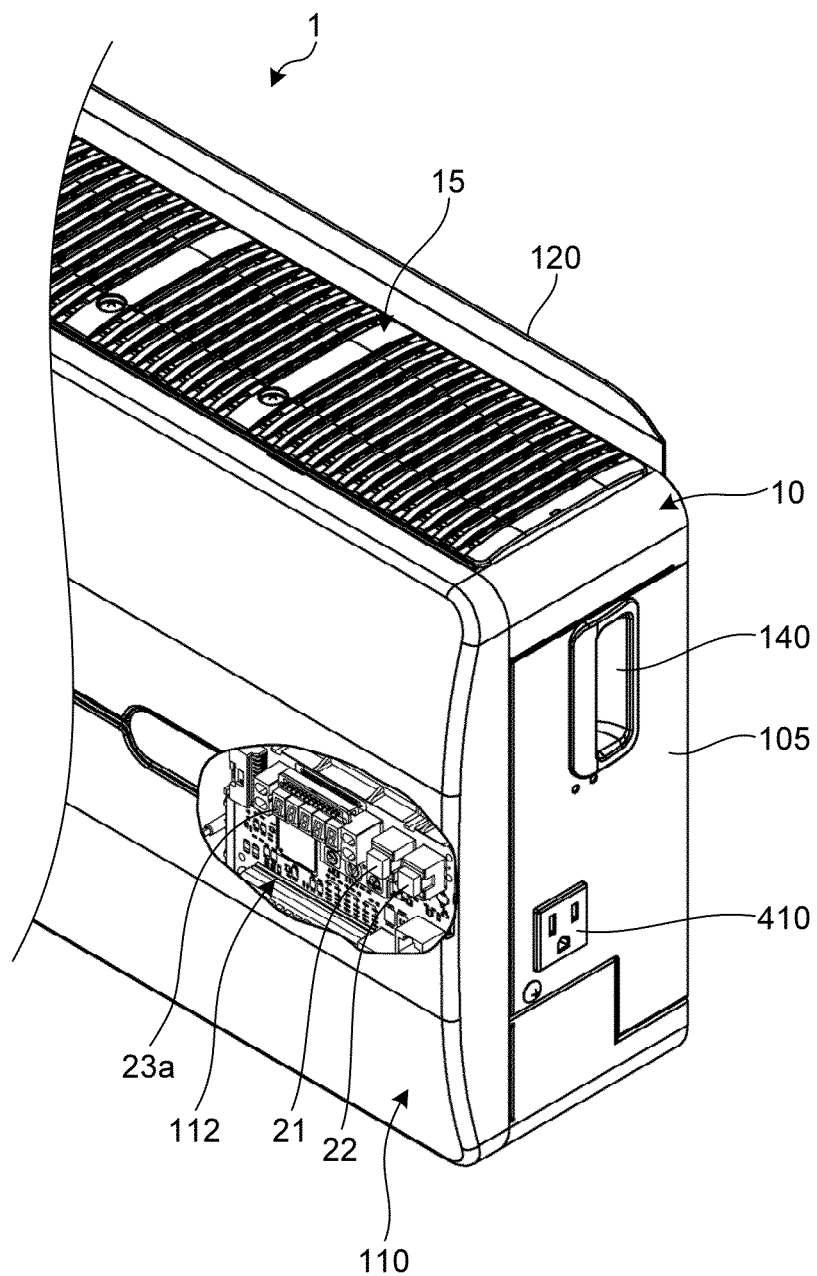
FIG. 9 is an explanation diagram obtained by cutting a part of the case of the power conversion apparatus according to the present embodiment.

An input-output board 20, in which operation switches 21 and 22 and a display unit 23 are provided, is arranged in the second side area 12 (see FIGS. 4 and 9).

Moreover, the power module 600 is placed close to at the backside of the first board 61. As illustrated in FIG. 3, the power module 600 has a circuit that includes the plurality of switching elements 601 to 606.

The switching element control circuit (see FIG. 2) of the second board 62 controls the switching elements 601 to 606. In FIG. 3, the illustration of the alternating-current electric reactor 72 is omitted.

Figure 5:
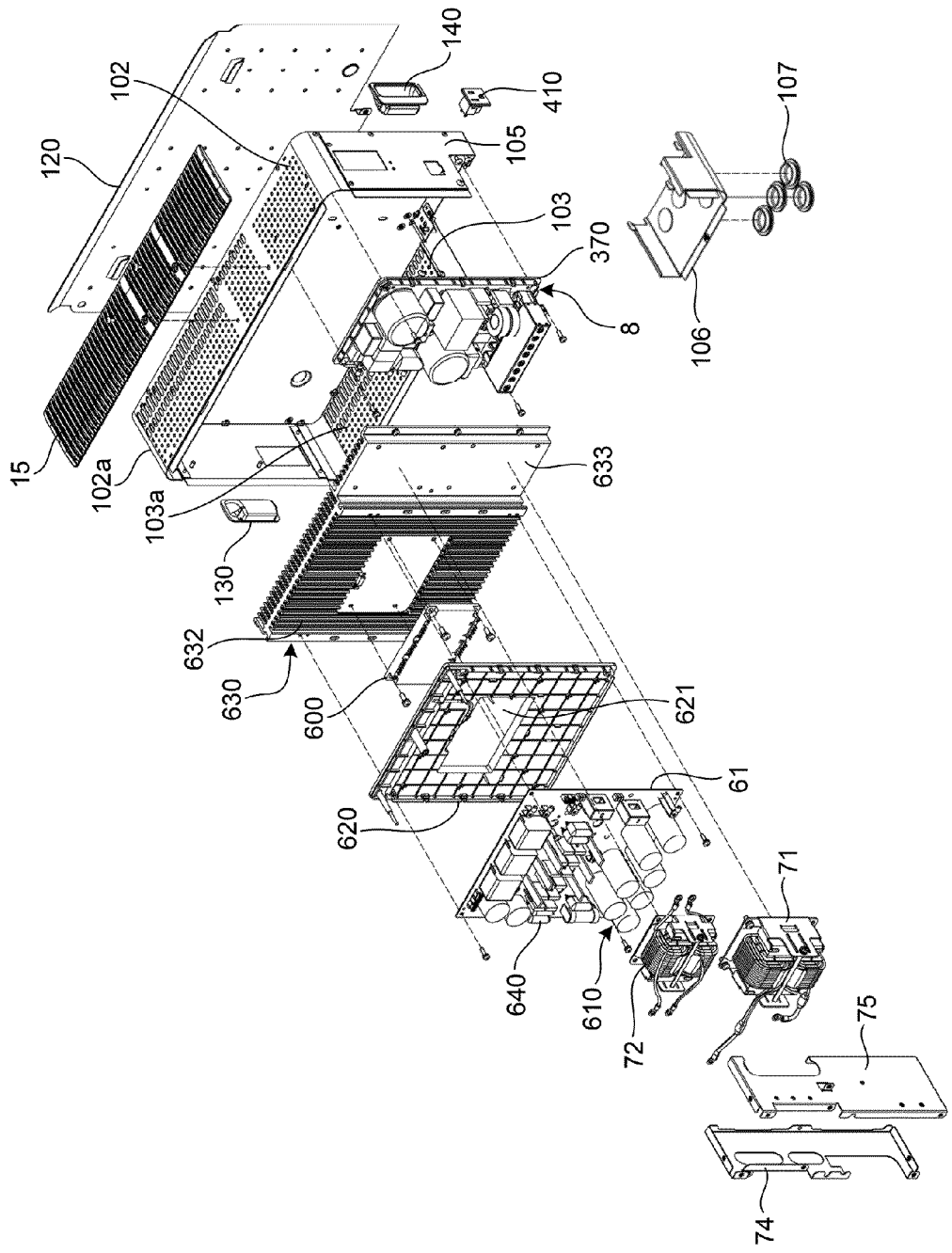
FIG. 5 is an exploded perspective view of the power conversion apparatus.

Herein, the internal configuration of the case 10 will be more specifically explained with reference to FIGS. 4 and 5. FIGS. 4 and 5 are exploded perspective views of the power conversion apparatus 1.

As illustrated in FIG. 4, the case 10 that forms the outside of the power conversion apparatus 1 is formed into a horizontally long and substantially rectangular shape when viewed from the front side. The case 10 includes a substantially rectangle boxy body 100 that has an opening part 100a at the front and a front panel 110 that is detachably attached to the opening part 100a through an insulating plate 150.

In other words, as illustrated in FIGS. 4 and 5, the first board 61 that has the power module 600 arranged at its backside, the second board 62, and the main control board 63 are sequentially arranged in the first side area 11 from the far side at predetermined intervals in an overlapping manner.

It has been explained in the present embodiment that the power conversion unit is constituted by a matrix converter circuit. However, the present embodiment is not limited to the matrix converter circuit. The power conversion unit may be constituted by an inverter circuit and a boost chopper circuit.

As illustrated in FIG. 5, a heat sink 630 is attached to the backside of the boxy body 100, and the first board 61 is attached to the heat sink 630 through a board fixing seat 620. Moreover, the power module 600 arranged at the backside of the first board 61 is abutted on the heat sink 630 to release heat to be generated by the switching elements 601 to 606 and thus heat storage is prevented. Moreover, a rectangular opening 621 in which the power module 600 is accommodated is formed in the board fixing seat 620.

A plurality of waveform fins 632 is formed in the heat sink 630 to be able to raise a cooling efficiency without heightening the height of the fin beyond necessity. Moreover, a heat sink extending unit 633 that extends up to the central area 13 is formed in the heat sink 630. The heat sink extending unit 633 abuts on the electric reactor 7.

In this way, the first board 61 and the second board 62, and the second board 62 and the main control board 63 are adjacently provided in the first side area 11 in an anteroposterior direction at predetermined intervals. The switching elements 601 to 606 are electrically connected to the switching element control circuit of the second board 62 by stacking connectors 640, which are pin-shaped conductors, through terminals provided on the first board 61.

Therefore, boards can be connected at shortest intervals to shorten the length of wiring and thus the occurrence of noise can be suppressed. Moreover, the first board 61, the second board 62, and the main control board 63 are arranged in the first side area 11 in an overlapping manner and thus the space-saving of the case 10 can be realized.

In other words, it is necessary to avoid an impact of noise to transmit a signal output from the switching element control circuit of the second board 62 to the switching elements 601 to 606 with high precision. Therefore, it is preferable that a distance between the first board 61 and the second board 62 is short as much as possible. On the other hand, it is necessary that heat generated by the switching elements 601 to 606 is suppressed not to be propagated to the switching element control circuit of the second board 62.

Therefore, as described above, according to the present embodiment, the first board 61 and the second board 62 are separated and are connected by the stacking connector 640. Therefore, the suppression of occurrence of noise and the avoidance of impact of heat can be realized. Moreover, because wiring saving is achieved by using the stacking connector 640, it can contribute to the miniaturization of the power conversion apparatus 1.

Meanwhile, as illustrated in FIG. 5, the main circuit smoothing capacitor 610 is provided under the first board 61. Because the lower portion of the case 10 is close to a slit group 103a formed on a lower plate 103 and comparatively easily becomes a low temperature in the case 10, a bad influence on an available time caused by heat is not exercised as far as possible. Moreover, a slit group 102a is formed on an upper plate 102 of the case 10 to face the slit group 103a of the lower plate 103. Moreover, a part of the lower plate 103 is cut, and a terminal cover 106 into which cable inserting bushes 107 are fitted is provided in the cut part.

As illustrated in FIG. 4, when the front panel 110 and the insulating plate 150 are removed, the input-output board 20 and a surge suppressing board 30 are exposed from the opening part 100a in the second side area 12.

The filter board 8 is arranged at the far side that is away from the input-output board 20 and the surge suppressing board 30 by a predetermined distance (see FIG. 5).

In other words, as illustrated in FIGS. 4 and 5, the filter board 8 is arranged at the far side in the second side area 12, and the input-output board 20 and the surge suppressing board 30 are arranged at predetermined intervals in an overlapping manner.

The surge suppressing board 30 is provided with a varistor and an arrester that are together arranged in a state where they are separated from each other. Exchange is easily performed by placing the surge suppressing board 30 at a position close to the front panel 110.

As illustrated in FIG. 4, when the front panel 110 and the insulating plate 150 are removed, a metallic front-side electric reactor cover 73 that covers the central area 13 is exposed from the opening part 100a.

In other words, the central area 13 is separated from the first side area 11 and the second side area 12 by using the metallic front-side electric reactor cover 73, a left-side electric reactor cover 74, a right-side electric reactor cover 75, and the heat sink extending unit 633 as bulkheads (see FIGS. 4 and 5).

In other words, the central area 13 is surrounded by the front-side electric reactor cover 73, the left-side electric reactor cover 74, the right-side electric reactor cover 75, and further the heat sink extending unit 633, and thus forms a wind tunnel 700 as illustrated in FIG. 2.

A vertical-direction exhaust heat flow channel 701 is formed in the wind tunnel 700 from the slit group 103a formed on the lower plate 103 of the case 10 to the slit group 102a formed on the upper plate 102 (see FIG. 2).

The direct-current electric reactor 71 and the alternating-current electric reactor 72 are respectively arranged on the downside and upside in the wind tunnel 700. Therefore, the electric reactor 7, which is arranged in the central area 13 constructed as the wind tunnel 700, is placed in the middle of the exhaust heat flow channel 701 and thus is effectively cooled off. Moreover, the direct-current electric reactor 71 and the alternating-current electric reactor 72 are directly attached to the heat sink extending unit 633 that constitutes a part of the wind tunnel 700. Therefore, a cooling effect is further increased.

In this way, because the heat sink 630 is arranged inside the case 10 and abuts on the electric reactor 7 and the power conversion board 6 that easily generate heat, temperature rise in the case 10 can be effectively suppressed. Moreover, because the wind tunnel 700 is formed of a metal plate, an impact of radiated noise caused by the electric reactor 7 can be avoided as much as possible, and thus electric components such as the power conversion board 6, the main control board 63, and the filter board 8, which are arranged in the first side area 11 and the second side area 12, have high reliability.

Meanwhile, when the direct-current electric reactor 71 and the alternating-current electric reactor 72 are included in the same power conversion apparatus 1, the direct-current electric reactor 71 is heavy. Therefore, because the relatively heavy direct-current electric reactor 71 is placed on the downside, a weight balance is good even if only the central area 13 is considered.

In FIG. 4, a reference number 650 indicates a second board fixing seat, a reference number 201 indicates a main control board fixing seat, and a reference number 301 indicates a surge suppressing board fixing seat. Moreover, in FIG. 5, a reference number 370 indicates a filter board fixing seat. The fixing seats are formed of resin to realize light weight. Moreover, the assembly of the boards is facilitated by using the fixing seats.

Figure 6A:
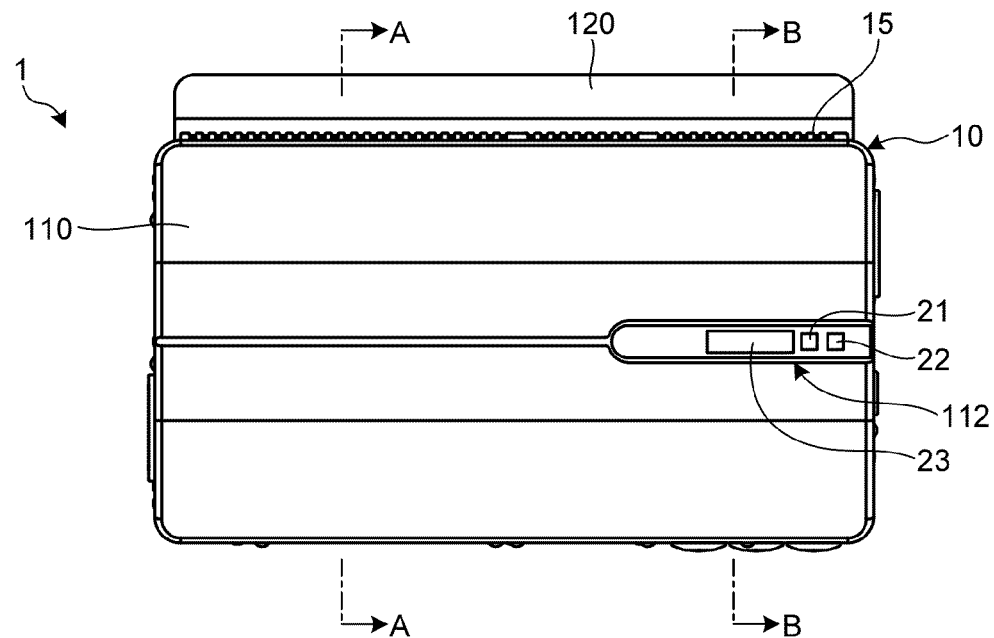
FIG. 6A is a front view of the power conversion apparatus according to the present embodiment.
Figure 6B:
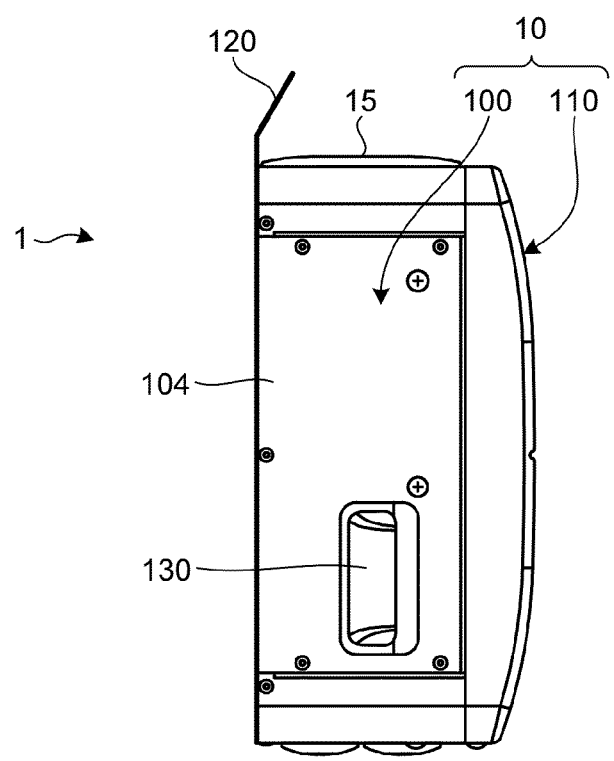
FIG. 6B is a left side view of the power conversion apparatus.
Figure 6C:
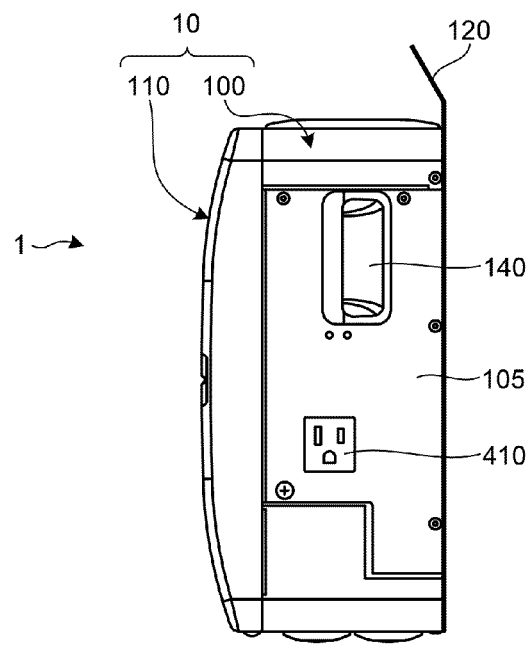
FIG. 6C is a right side view of the power conversion apparatus.
Figure 6D:
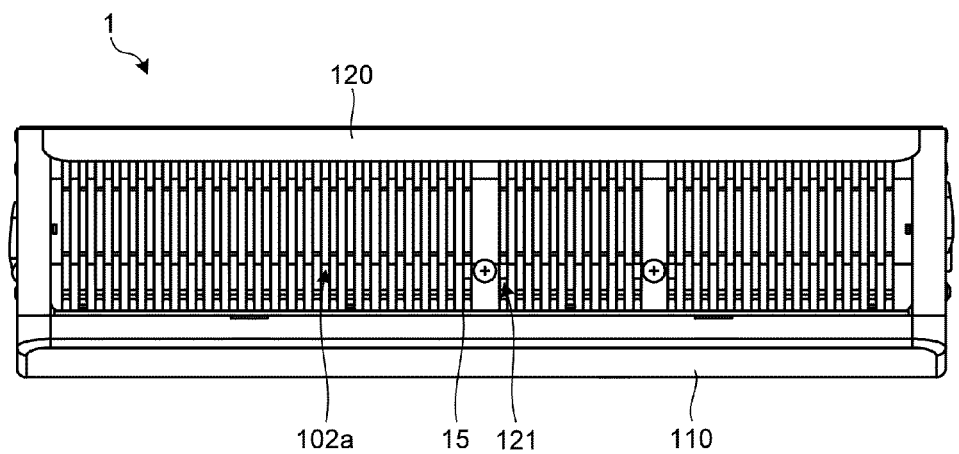
FIG. 6D is a plan view of the power conversion apparatus.
Figure 7:
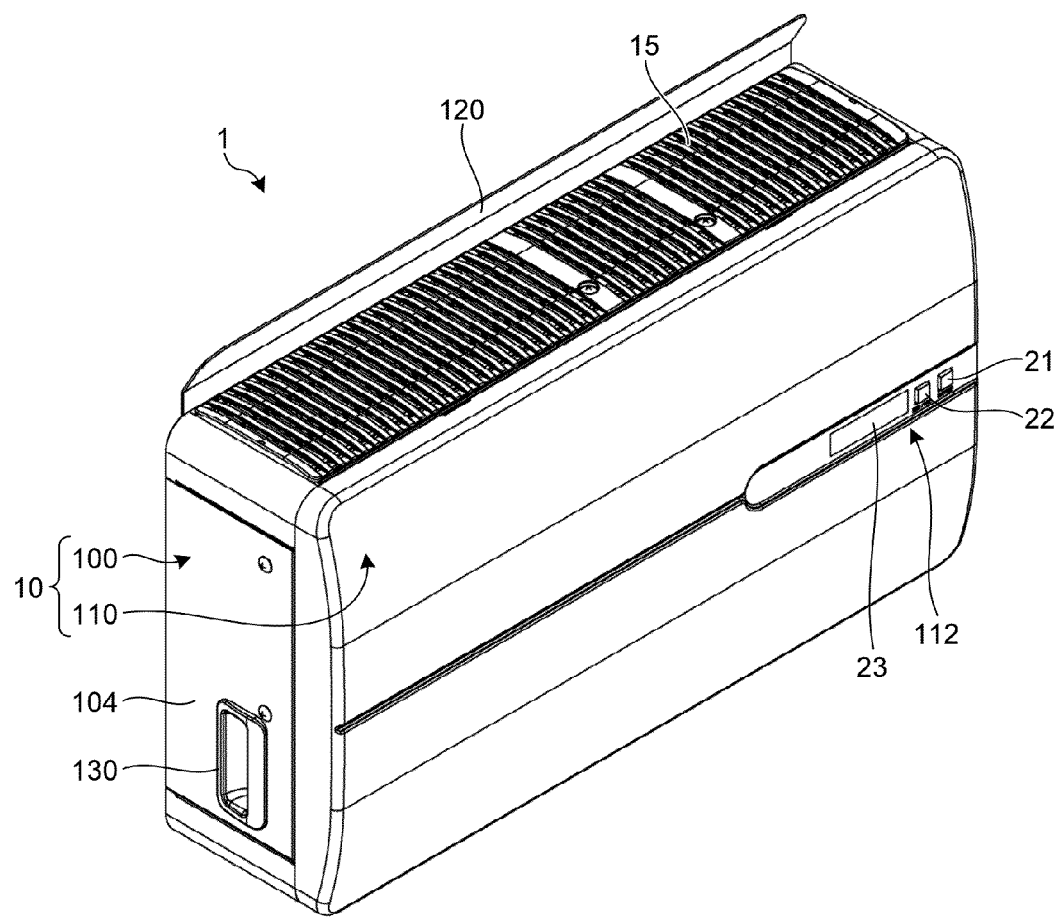
FIG. 7 is a perspective view of the power conversion apparatus.
Figure 8A:
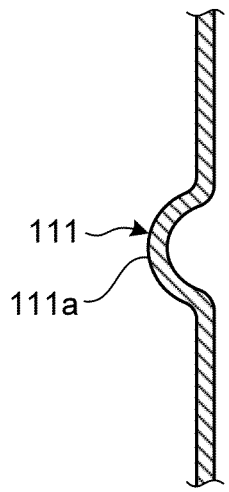
FIG. 8A is a cross-sectional view taken along an A-A line of FIG. 6A, which is partially omitted and expanded.
Figure 8B:
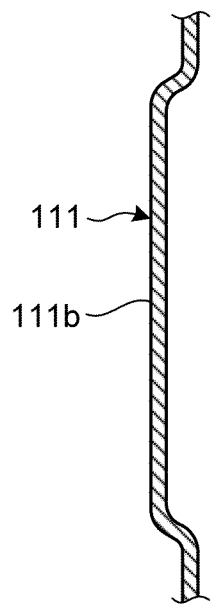
FIG. 8B is a cross-sectional view taken along a B-B line of FIG. 6A, which is partially omitted and expanded.
Figure 10:
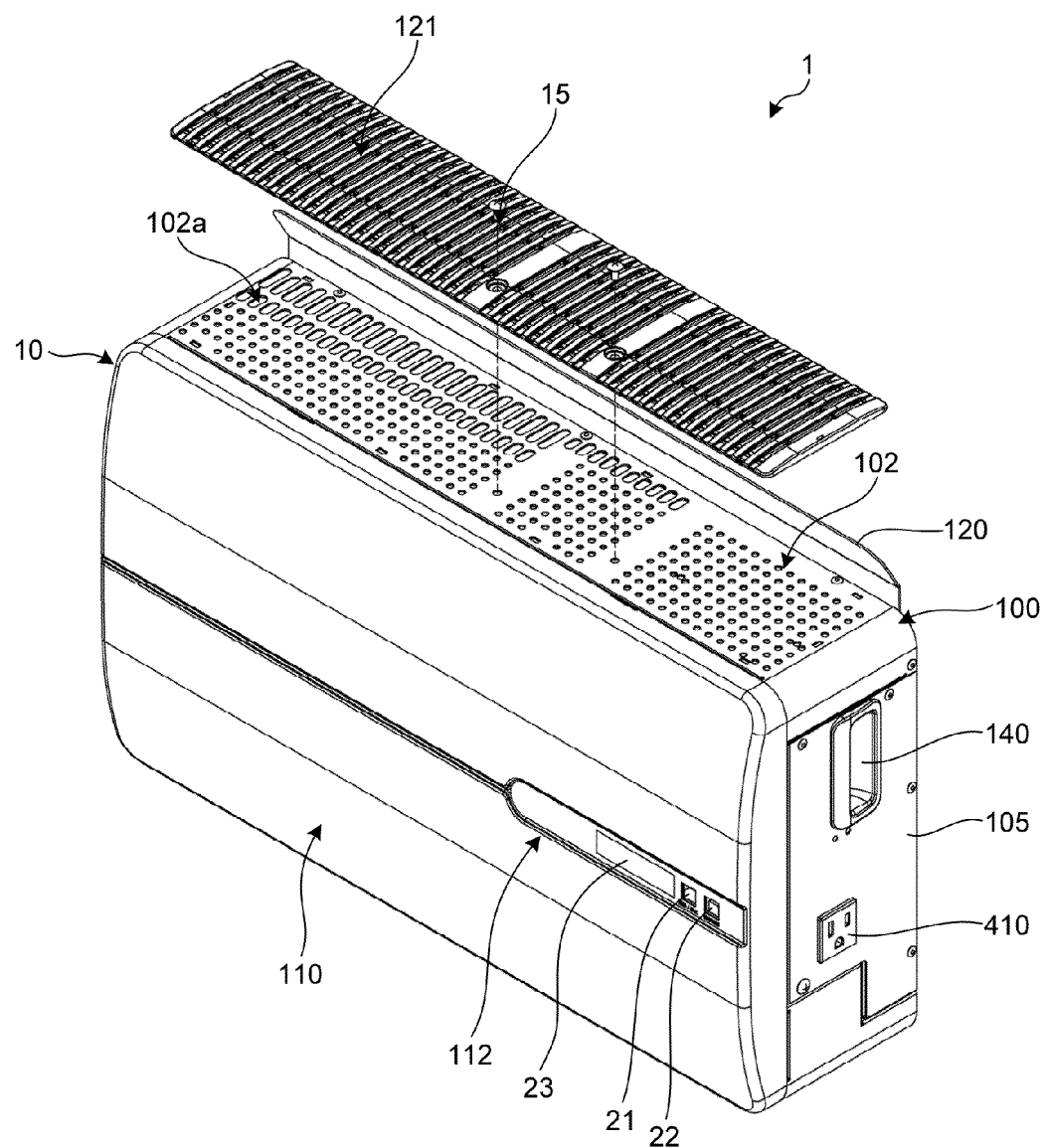
FIG. 10 is an explanation diagram of an upper cover of the case of the power conversion apparatus.

Next, an external shape of the power conversion apparatus 1 will be explained with reference to FIGS. 6 to 10. FIG. 6A is a front view of the power conversion apparatus 1 according to the present embodiment. FIGS. 6B, 6C, 6D, and 6E are respectively its left side view, its right side view, its plan view, and its bottom view. Moreover, FIG. 7 is a perspective view of the power conversion apparatus 1. Moreover, FIG. 8A is an A-A expanded sectional view of FIG. 6A and FIG. 8B is a B-B expanded sectional view of FIG. 6A. Moreover, FIG. 9 is an explanation diagram obtained by cutting a part of the case 10 of the power conversion apparatus 1. FIG. 10 is an explanation diagram of an upper plate cover 15 of the case 10 of the power conversion apparatus 1.

The case 10 that represents the outside of the power conversion apparatus 1 is formed of a metal plate. Moreover, as illustrated in FIGS. 6 and 7, the case 10 includes the boxy body 100 that has the opening part 100a at its front and the front panel 110 that is attached to the opening part 100a.

As illustrated in FIG. 6A, an operating unit 112 in which the operation switches 21 and 22 and the display unit 23 are provided at the middle right position is provided in the front panel 110.

As illustrated in FIG. 9, the operation switches 21 and 22 are provided on the input-output board 20, which is arranged at the backside of the front panel 110, along with a seven-segment display 23a that constitutes the display unit 23. Moreover, the seven-segment display 23a is supported to project from the input-output board 20 to face the display unit 23 of the front panel 110.

The front panel 110 is formed of a metal plate and has a totally round shape. As illustrated in FIGS. 8A and 8B, the front panel 110 also forms a rib 111 that extends in a horizontal direction at its substantial center. The rib 111 is subjected to a deep drawing process in such a manner that its convex portion is directed to its inside. The rib 111 has a narrow-width rib portion 111a (FIG. 8A), which is formed from the left side to the right side when viewed from the front side, and a broad-width rib portion 111b (FIG. 8B), which is formed on an area in which the operating unit 112 is provided.

In this way, because the power conversion apparatus 1 according to the present embodiment has a totally round shape and is provided with the rib 111, the design of the front panel 110 that most easily catches someone's eye from the viewpoint of the shape is improved also from the viewpoint of design and further the rigidity of the front panel 110 is realized at low cost.

The boxy body 100 to which the front panel 110 is attached is formed of a substantially rectangular boxy body that has a backside plate 101, the upper plate 102, the lower plate 103, a left-side plate 104, and a right-side plate 105. As illustrated in FIG. 6B, a left knob 130 is provided at the position slightly close to the front panel 110 in the lower portion of the left-side plate 104. As illustrated in FIG. 6C, a right knob 140 is provided at the position slightly close to its backside in the upper portion of the right-side plate 105. Moreover, the electrical outlet 410 is provided at the lower-side position of the right knob 140.

In this way, the power conversion apparatus 1 according to the present embodiment includes a pair of knobs of the left knob 130 and the right knob 140 that are provided to be mutually diagonal positions on the left-side plate 104 and the right-side plate 105 that form both-side walls of the boxy body 100. Therefore, as compared to symmetrical knobs of a normal power conversion apparatus, the power conversion apparatus 1 according to the present embodiment has the configuration by which the power conversion apparatus 1 can be easily carried and mounted on the wall.

The utility obtained by arranging knobs at mutually diagonal positions will be more specifically explained. The power conversion apparatus 1 according to the present embodiment has a weight of ten-odd Kg. When such a heavy load is mounted on a wall, for example, when the heavy load is taken out from a storage box, an operator easily takes out the heavy load from the storage box because one of the left knob 130 and the right knob 140 is located at the position close to the operator. Then, when the operator takes up the heavy load in order to mount it on the wall, one-side hand of the operator is located downward to deeply take up the power conversion apparatus 1 and thus the operator can easily take up it upward at once.

Figure 6E:
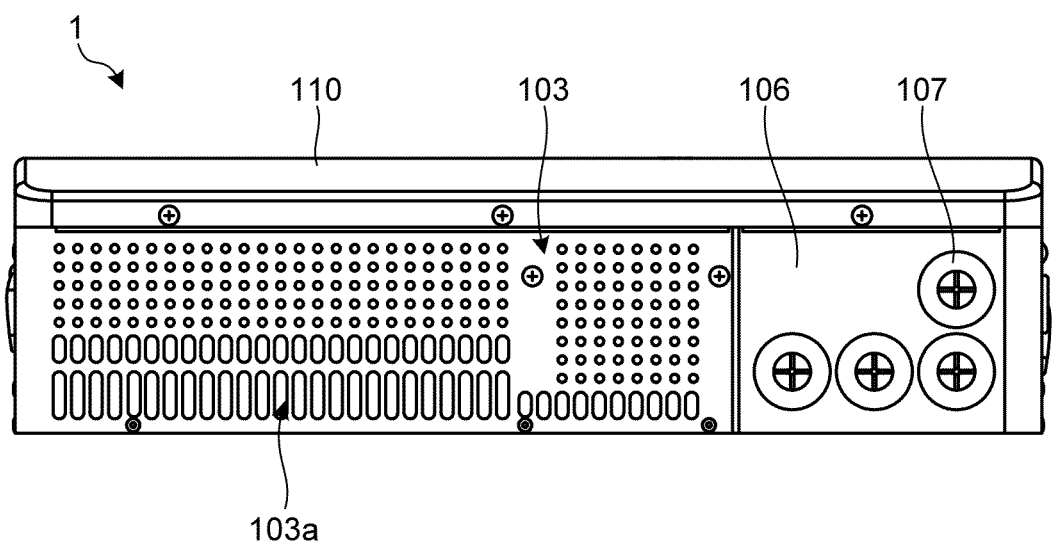
FIG. 6E is a bottom view of the power conversion apparatus.

As illustrated in FIGS. 10 and 6E, the upper plate 102 and the lower plate 103 of the boxy body 100 respectively includes the slit groups 102a and 103a.

These slit groups 102a and 103a are formed to release heat emitted from the power conversion board 6 and the electric reactor 7 that are main components housed inside the case 10. In other words, air gets into from the slit group 103a of the lower plate 103 and gets out from the slit group 102a of the upper plate 102. At this time, a part of airflow passes between the waveform fins 632 of the heat sink 630. Thus, heat is taken from the heat sink 630 through the waveform fins 632.

The upper plate cover 15 formed of resin is further provided on the upper plate 102. A cover slit group 121 is also formed on the upper plate cover 15. Moreover, the slits of the cover slit group 121 are formed to be partially overlapped with the slits of the slit group 102a of the upper plate 102, and thus intrusion of foreign materials can be prevented without bringing about obstacles to exhaust.

In this way, the power conversion apparatus 1 according to the present embodiment mounts thereon the upper plate cover 15 formed of resin, which has a foreign material intrusion prevention function and does not increase a weight uselessly. Therefore, dust or the like is prevented from intruding into the case 10 as far as possible, and the slit group 102a of the upper plate 102 is prevented from being filled up with dust or the like. Therefore, a flow of air from the slit group 103a of the lower plate 103 is not obstructed to be able to be smoothly exhausted, and thus the rise of an internal temperature of the case 10 can be suppressed.

As described above, according to the power conversion apparatus 1 according to the present embodiment, the case 10 is sectioned into the first side area 11, the central area 13, and the second side area 12 in a longitudinal direction, and the electric reactor 7 that is a heavy load is arranged in the central area 13 that is located at the center. Therefore, a weight balance is improved remarkably, and thus the power conversion apparatus can be provided on the mounting wall surface 200 in a stable state.

Meanwhile, the power conversion board 6 arranged in the first side area 11 becomes high temperature. However, because the filter board 8 and the external connection terminal pedestal 9 are arranged in the second side area 12 that is away from the first side area 11 while sandwiching the central area 13 therebetween, the filter board 8 and the external connection terminal pedestal 9 can be protected from heat. Moreover, because the wind tunnel 700 is formed in the central area 13, effective cooling can be performed on the first side area 11 and the second side area 12 that are formed to sandwich the central area 13 therebetween.

Moreover, because a length of wiring for connecting the first board 61, the second board 62, and the main control board 63 can be shortened as much as possible, the generation of noise can be prevented.

Moreover, it has been explained that the power conversion apparatus 1 described above has the configuration that the electric reactor 7 includes the direct-current electric reactor 71 for boosting and the alternating-current electric reactor 72 for suppressing higher harmonic waves. However, the electric reactor 7 may include any one of them.

Although the power conversion apparatus 1 has been explained through the embodiment described above, additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A power conversion apparatus comprising:
    a case that can be provided on a mounting wall surface and places therein an electric reactor and a power conversion board for performing power conversion between a predetermined power generator and a commercial electric power system,
    the case being sectioned into a central area and first and second side areas that sandwich the central area therebetween,
    the central area being sectioned by metallic bulkheads and being configured as a wind tunnel that has a vertical-direction exhaust heat flow channel,
    the electric reactor being arranged in the central area, and
    the power conversion board being arranged in one side area of the first and second side areas; and
    an external connection terminal pedestal that includes at least an input terminal and an output terminal for the power conversion board being arranged in the other side area of the first and second side areas.

2. The power conversion apparatus according to claim 1, wherein the electric reactor includes one or both of an electric reactor for boosting and an electric reactor for suppressing higher harmonic waves.

3. The power conversion apparatus according to claim 1, wherein the power conversion board includes a power module that has a plurality of switching elements and a power conversion unit that converts DC power generated by the power generator into AC power.

4. The power conversion apparatus according to claim 2, wherein the power conversion board includes a power module that has a plurality of switching elements and a power conversion unit that converts DC power generated by the power generator into AC power.

5. The power conversion apparatus according to claim 1, wherein a heat sink is arranged at a side close to the mounting wall surface in the case and is abutted on the power conversion board and the electric reactor.

6. The power conversion apparatus according to claim 1, wherein
    the power conversion board includes:
        a first board that includes the power module; and
        a second board that includes a switching element control circuit that controls the plurality of switching elements of the power module,
    the first board is arranged at the side close to the mounting wall surface in the case,
    the second board is arranged at an opposite side of the mounting wall surface with respect to the first board at predetermined intervals in an overlapping manner, and
    the both boards are electrically connected by a pin-shaped conductor.

7. The power conversion apparatus according to claim 1, wherein
    the case includes:
        a boxy body that has an opening part at the opposite side of the mounting wall surface; and
        a front panel that is detachably attached to the opening part of the boxy body, and
        a surge suppressing board is arranged at a position close to the front panel.

8. The power conversion apparatus according to claim 7, wherein a pair of knobs placed at mutually diagonal positions is provided on both-side walls of the boxy body.

9. The power conversion apparatus according to claim 1, further comprising:

a main circuit electrically connected by wiring in which the main circuit is wired by performing one reciprocating action in the case, wherein the wiring electrically connects between the input terminal of the external connection terminal pedestal being arranged in the one side area and the power conversion board being arranged in the other side area, and between the output terminal of the external connection terminal pedestal being arranged in the one side area and the power conversion board being arranged in the other side area.

10. The power conversion apparatus according to claim 1, further comprising:

a main circuit electrically connected by wiring in which the main circuit is wired by performing one reciprocating action in the case, wherein the electric reactor is an alternating-current electric reactor, wherein the alternating-current electric reactor is arranged in the central area, and wherein the wiring electrically connects between the input terminal of the external connection terminal pedestal being arranged in the one side area and the power conversion board being arranged in the other side area, between the power conversion board and the alternating-current electric reactor being arranged in the central area, and between the alternating-current electric reactor and the output terminal of the external connection terminal pedestal being arranged in the one side area.

\* \* \* \* \*